(12) United States Patent
Garriga

(10) Patent No.: US 6,451,118 B1
(45) Date of Patent: Sep. 17, 2002

(54) CLUSTER TOOL ARCHITECTURE FOR SULFUR TRIOXIDE PROCESSING

(75) Inventor: Rudolph A. Garriga, Los Altos, CA (US)

(73) Assignee: Anon, Inc., Los Altos, CA (US)

( * ) Notice: Subject to any disclaimer, the term of this patent is extended or adjusted under 35 U.S.C. 154(b) by 68 days.

(21) Appl. No.: 09/713,131

(22) Filed: Nov. 14, 2000

(51) Int. Cl.⁷ .......................... H01L 21/00; B65G 49/00
(52) U.S. Cl. .................. 118/715; 156/345; 204/298.25; 204/298.35
(58) Field of Search ................................ 118/715, 719; 156/345; 204/298.35, 398.25

(56) References Cited

U.S. PATENT DOCUMENTS

| | | | |
|---|---|---|---|
| 5,037,506 A | 8/1991 | Gupta et al. | 156/646 |
| 5,763,016 A | 6/1998 | Levenson et al. | 427/510 |
| 6,257,827 B1 * | 7/2001 | Hendrickson et al. | 414/805 |

* cited by examiner

*Primary Examiner*—Thi Dang
(74) *Attorney, Agent, or Firm*—David W. Collins

(57) ABSTRACT

A cluster tool architecture and method are provided for processing substrates by exposure to a process environment, including a reactive gas, such as sulfur trioxide, as well as prior and subsequent treatments thereto. The cluster tool architecture comprises: (a) an atmospheric processing area, maintained at atmospheric pressure or higher; (b) cassette means for introducing a plurality of the substrates into the atmospheric processing area; (c) at least one process station in the atmospheric processing area; (d) an enclosed vacuum processing area, maintained at a vacuum pressure; (e) a first buffer station between the atmospheric processing area and the enclosed vacuum processing area; (f) at least one process station in the enclosed vacuum processing area isolated from the enclosed vacuum processing area by an isolation valve for exposing the substrates to the process environment; (g) a second buffer station between the atmospheric processing area and the enclosed vacuum processing area; (h) an atmospheric transfer arm in the atmospheric processing area for transferring the substrates from the cassette means between one of the buffer stations and at least one process station in the atmospheric processing area and then to the cassette means; and (i) a vacuum transfer arm in the enclosed vacuum processing area for transferring the substrates from one of the buffer stations to one of the vacuum process stations in the enclosed vacuum processing area and from that vacuum process station in the enclosed vacuum processing area to the buffer station, wherein both buffer stations are equally accessible to both the atmospheric transfer arm and the vacuum transfer arm. The cluster tool architecture integrates atmospheric or high pressure processing with vacuum processing. Since integration allows random access, there is a freedom of programming process flow. The architecture allows re-entry of substrates, so that process steps can be repeated at any time, and it allows substrates to be replaced back into original cassette after process is complete.

26 Claims, 6 Drawing Sheets

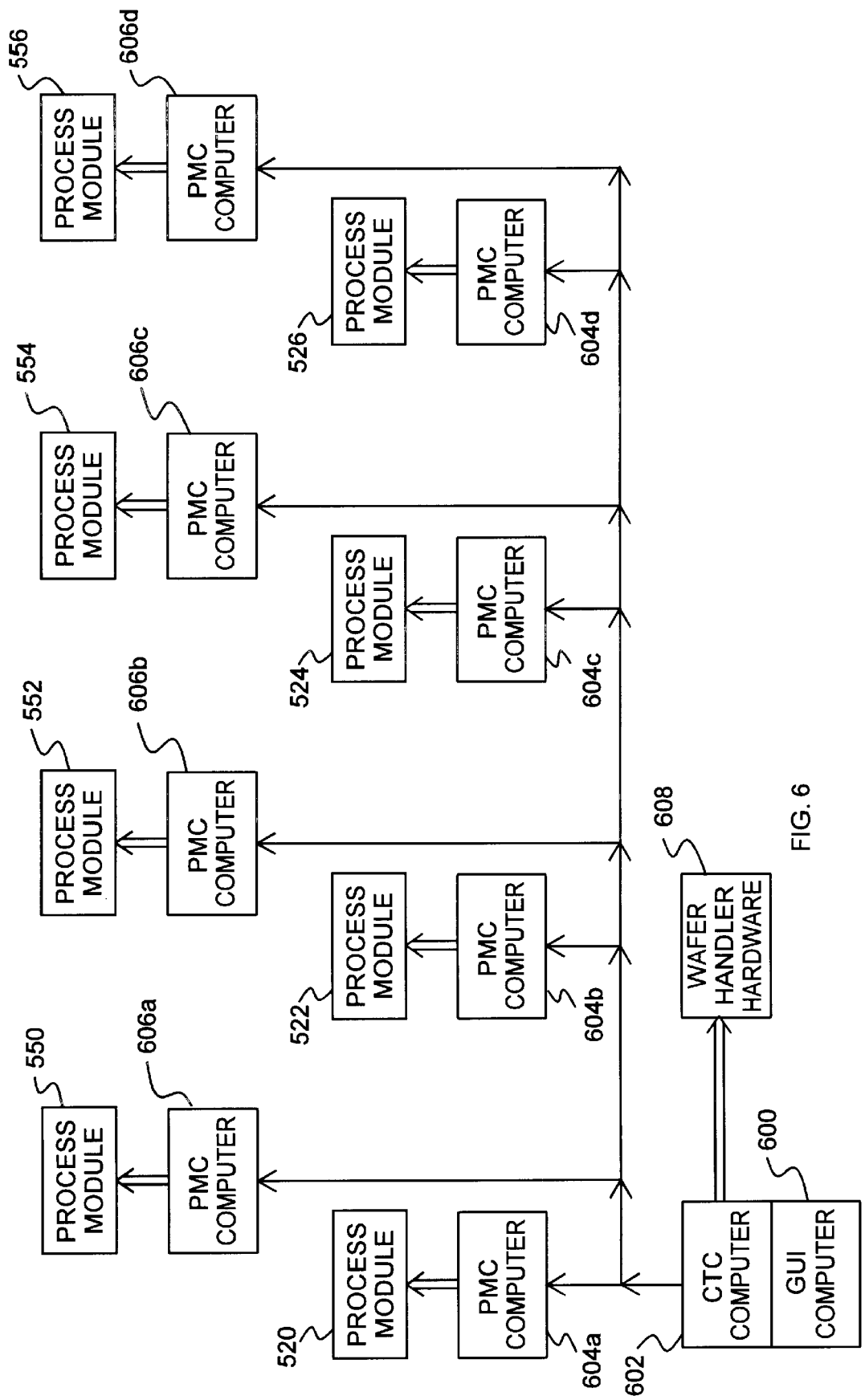

CLUSTER TOOL ARCHITECTURE FOR SULFUR TRIOXIDE PROCESSING

TECHNICAL FIELD

The present invention is directed to cluster tools for processing wafers and the like, and, more particularly, to a cluster tool architecture to be used, inter alia in sulfur trioxide processing of such wafers.

BACKGROUND ART

Cluster tools have been available for many years. Such tools are used for automated processing of semiconductor wafers, for example. FIGS. 1–4 are schematic drawings of prior art cluster tools, and are shown here as an aid to differentiate the present invention from the prior art cluster tools.

FIG. 1 depicts an example of prior art cluster tool architecture, 110, which is similar to a sputtering tool produced by Varian Associates. In this architecture, silicon wafers (not shown) are handled alternately from cassettes 112 and 114. First, the entire cassette assembly is pumped down to vacuum and the substrates are unloaded, one at a time, by means of a vacuum transfer arm 116 to an alignment station 117. The substrates are then loaded with a second arm 118 into one of several process stations 120, 122, 124, or 126, and then out to a de-gas and cool-down station 128 and finally back into the original cassette. This architecture primarily provides a method for integrating several vacuum processes, which can be performed in a random order. The sputtering tool 110 is a vacuum-only processing apparatus.

FIG. 2 depicts a second type of cluster tool architecture 210, similar to the cluster tool manufactured by Applied Materials, which integrates several vacuum processes that must be isolated and performed at different vacuum levels. In this architecture, cassettes 212 and 214 are pumped down from atmosphere, and the wafers are unloaded one at a time, aligned and then reloaded into the process chambers 232, 234, 236, and 238 by means of the vacuum transfer arm 216. In the cluster tool architecture 210, the process chambers are specifically limited to vacuum processes such as chemical vapor deposition (CVD). After CVD, the wafer is loaded into the buffer station 240, where it is purged and further pumped down for lower vacuum processing in sputtering stations 220, 222, 224, and 226, employing vacuum transfer arm 218. After sputtering, the wafer is loaded into a second buffer station 242, where pressure is changed to match the pressure in the area 216 (different vacuum level). The wafer is then cooled down and moved from the buffer station to any of the CVD process chambers 232, 234, 236, or 238 or out of the apparatus into one of the cassettes 213, 214. Cluster tool architecture 210 is a random order processing with two isolated sections. However, it is still a vacuum-processing tool.

FIG. 3 depicts a third architecture 310, which is similar to the tools manufactured by Brooks Automation, PRI, and others. This architecture is based on the concept of staging two or more cassettes 312a, 312b, 314a, and 314b, to unload wafers, one at a time, in atmosphere, using an atmosphere transfer arm 316. The wafers are aligned, if required, at flat-finding station 317 before being loaded into the buffer station 340, which is then pumped down to vacuum. Once the buffer station 340 is at vacuum, a second vacuum robot 318 unloads the buffer station and loads the wafer, in random order, to the first available vacuum process chamber 320, 322, 324, or 326. After processing, the wafers are removed and loaded into the second buffer station 342 to be vented back to atmosphere and loaded to its original cassette or any available cassette 312a, 312b, 314a, or 314b.

FIG. 4 depicts an example of a forth prior art architecture 410 which combines vacuum and atmospheric processing in a linear architecture, similar to the architecture employed in the Lam Research metal-etch tool. Here, the wafer is unloaded from the cassette 412, aligned at an aligner 417, and loaded into a buffer station 440, which is pumped down to vacuum. Subsequently, the wafer is loaded into a plasma etch chamber 420 (in vacuum) for processing, and is moved into a separate buffer station 442 for venting to atmosphere. After venting, the wafer is loaded to a clean station 444 where the wafer is rinsed or scrubbed with water, at atmosphere, and then dried and loaded into an exit cassette 446. The prior art architecture 410 provides a linear processing sequence that is inflexible to accommodate variations in the processing steps.

The disadvantages of prior art approaches are:

1. cluster tool processing is done only in a vacuum environment;
2. the atmospheric section of the cluster tool does not integrate atmospheric processing in a cluster format; and
3. tool architectures that have integrated vacuum and atmospheric processing have done so in a linear work flow format. This linear architecture does not allow wafers to return to an original slot in the cassette. Neither does it allow a plurality of processing chambers for parallel processing, in order to achieve a higher throughput.

Processing of wafers using sulfur trioxide is the subject of U.S. Pat. No. 5,037,506, issued Aug. 6, 1991, and U.S. Pat. No. 5,763,016, issued Jun. 9, 1998. Automated processing of wafers with sulfur trioxide requires controlled atmospheres prior to, during, and subsequent to the exposure to sulfur trioxide, due to the various processing steps involved.

However, the prior art architectures are unable to perform sulfur trioxide processing. All known prior art tools, with the exception of Brooks/PRI tool (FIG. 3), transfer wafers under pumped down conditions and all of the processing takes place in vacuum or a reduced atmosphere environment. In the Brooks/PRI tools, while wafer cassettes are unloaded in atmosphere, no atmospheric processing is performed. The Brooks/PRI architecture's intent is to load substrates to a vacuum processing cluster tool from a number a multiple of wafer cassettes staged in atmosphere.

Thus, there is a need for a cluster tool architecture to process wafers in the presence of sulfur trioxide, or other reactive gases such that it permits: (1) loading the wafers in an atmospheric-cluster environment, (2) performing one or more atmospheric processes, (3) exchanging wafers between atmospheric and vacuum environments, (4) random order processing using a multiple of vacuum-compatible processing stages, (5) returning the waters to the atmospheric-cluster environment for additional atmospheric processing, and (6) finally returning the wafers to an exit cassette or the original cassette slot.

DISCLOSURE OF INVENTION

In accordance with the present invention, a cluster tool architecture and method are provided for processing substrates by exposure to sulfur trioxide and other process environments, as well as prior and subsequent treatments thereto. The cluster tool architecture comprises:

(a) an atmospheric processing area, maintained at atmospheric pressure;

(b) cassette means for introducing a plurality of the substrates into the atmospheric processing area;

(c) at least one process station in the atmospheric processing area for exposing the substrates to a first process environment;

(d) an enclosed vacuum processing area, maintained at a vacuum pressure;

(e) a first buffer station between the atmospheric processing area and the enclosed vacuum processing area to pump and vent from atmospheric to vacuum pressures and transition the substrates from the atmospheric processing area to the enclosed vacuum processing area;

(f) at least one process station in the enclosed vacuum processing area for exposing the substrates to a second process environment;

(g) a second buffer station between the enclosed processing area and the atmospheric processing area to re-pressurize from vacuum to atmospheric pressures and transition the substrates from the enclosed vacuum processing area to the atmospheric processing area;

(h) an atmospheric transfer arm in the atmospheric processing area for transferring the substrates from the cassette means between one of the buffer stations and at least one process station in the atmospheric processing area and then to the cassette means; and (i) a vacuum transfer arm in the enclosed vacuum processing area for transferring the substrates from the one of the buffer stations to one of the process stations in the enclosed vacuum processing area and from that process station in the enclosed vacuum processing area to the one of the buffer stations, wherein both buffer stations are equally accessible to both the atmospheric transfer arm and the vacuum transfer arm.

The first process environment can comprise a pre-processing step, such as cleaning and rinsing the substrate, or it can comprise atmospheric-compatible physical or chemical process steps prior to entry into the enclosed vacuum processing area and/or it can comprise a post-processing step subsequent to processing of the substrate in the enclosed vacuum processing area.

The second process environment can comprise sulfur trioxide, a $CO_2$ blast, plasma, or other chemically or physically reactive environments.

The invention disclosed and claimed herein is an improvement over previous art in that it:

1. integrates atmospheric or high pressure processing with vacuum processing;
2. allows random access through integration, so there is a freedom of programming process flow;
3. allows re-entry of substrates, in that process steps can be repeated at any time; and
4. allows substrates to be replaced back into the cassette of origination or predetermined exit cassette after the process is complete.

The cluster tools of the prior art achieve some of these features, but none can achieve all of the features. While some prior art cluster tools appear to be similar to the cluster tool disclosed and claimed herein, such cluster tools integrate atmospheric handling, a large number of cassettes in atmosphere, and vacuum automation, and do not deal with atmospheric processing in conjunction with vacuum processing. Specifically, the main feature of the cluster tool of the present invention is that processing for any known semiconductor process can be integrated in a single substrate at a time, in a cluster format. This feature is not believed to have been done before, to the knowledge of the inventor.

Indeed, the processing cluster tool of the present invention may appear to be similar to the linear Lam tool (FIG. 4), in that the substrates are loaded from atmosphere to buffer, which brings the substrates into the vacuum environment for processing, then vented back to atmosphere for subsequent atmospheric processing. However, the difference between the tool of the present invention and the Lam tool is that in the tool of the present invention, the substrates are loaded and unloaded in a random access architecture of a cluster tool. By "random access architecture" is meant that the substrate flow goes to the first available station, and does not follow a pre-defined, fixed route. The Lam tool is a linear format in which substrates go from an input cassette to an exit cassette. The tool of the present invention is a random access tool in which substrates go from an input cassette back to the original slot in that cassette on output.

Other objects, features, and advantages of the present invention will become apparent upon consideration of the following detailed description and accompanying drawings, in which like reference designations represent like features throughout the FIGURES.

BRIEF DESCRIPTION OF THE DRAWINGS

The drawings referred to in this description should be understood as not being drawn to scale except if specifically noted.

FIG. 5b—notch); and FIG. 6 is a schematic view of computer architecture used to provide computer control of the cluster tool architecture used in the practice of the present invention.

BEST MODES FOR CARRYING OUT THE INVENTION

Figure 1:
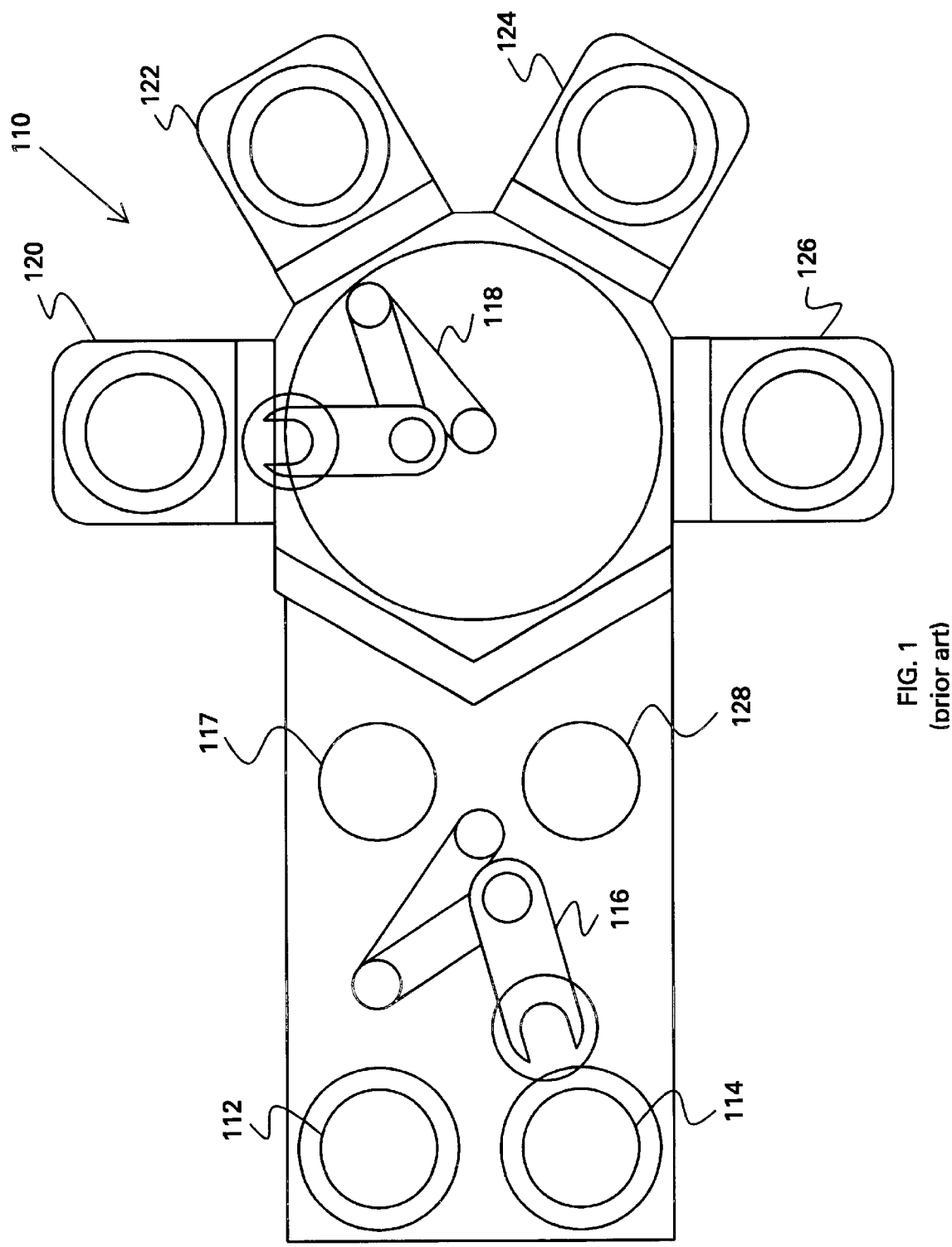
FIG. 1 is a schematic diagram of a first prior art cluster tool architecture.
Figure 2:
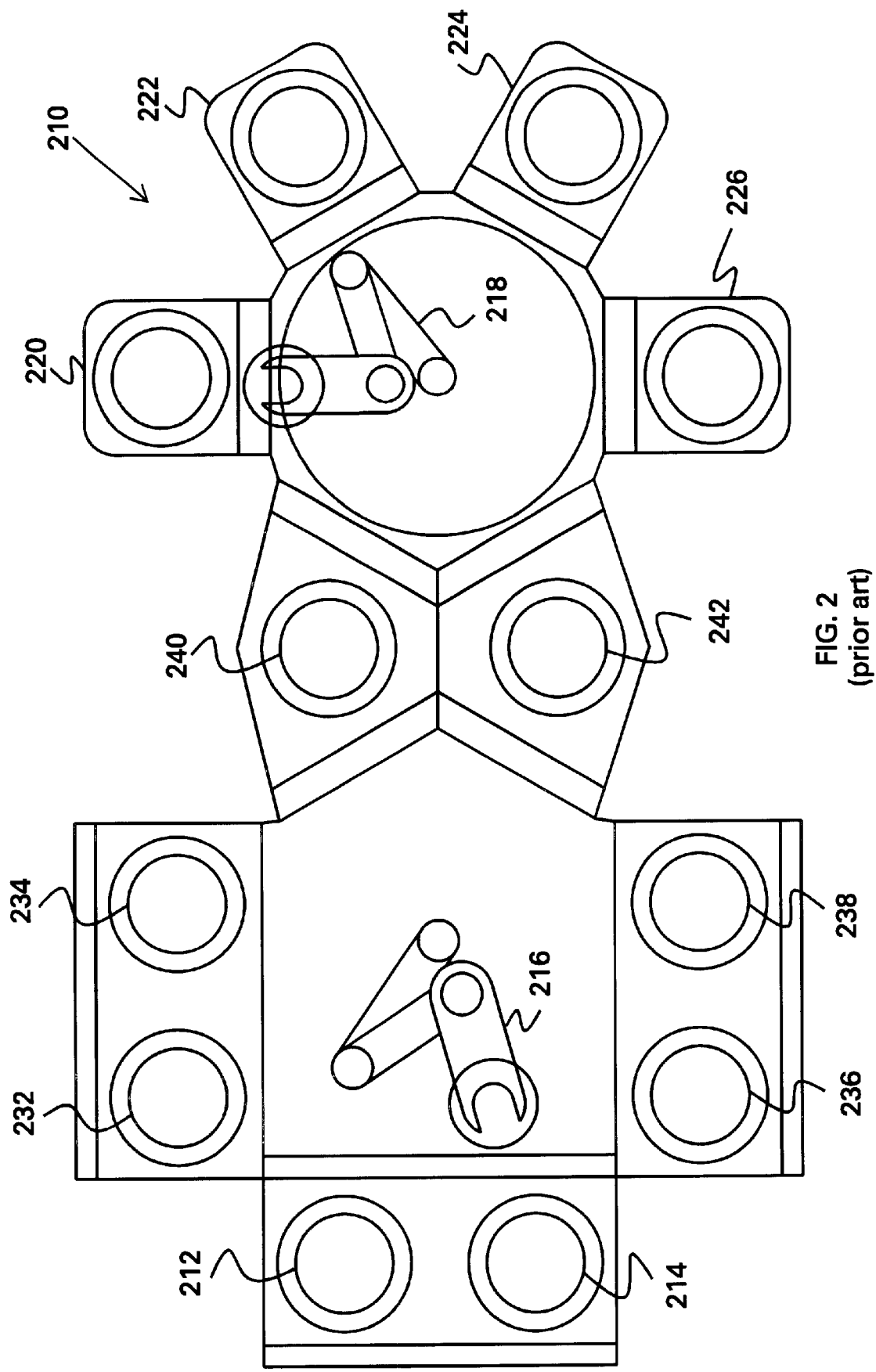
FIG. 2 is a schematic diagram of a second prior art cluster tool architecture.
Figure 3:
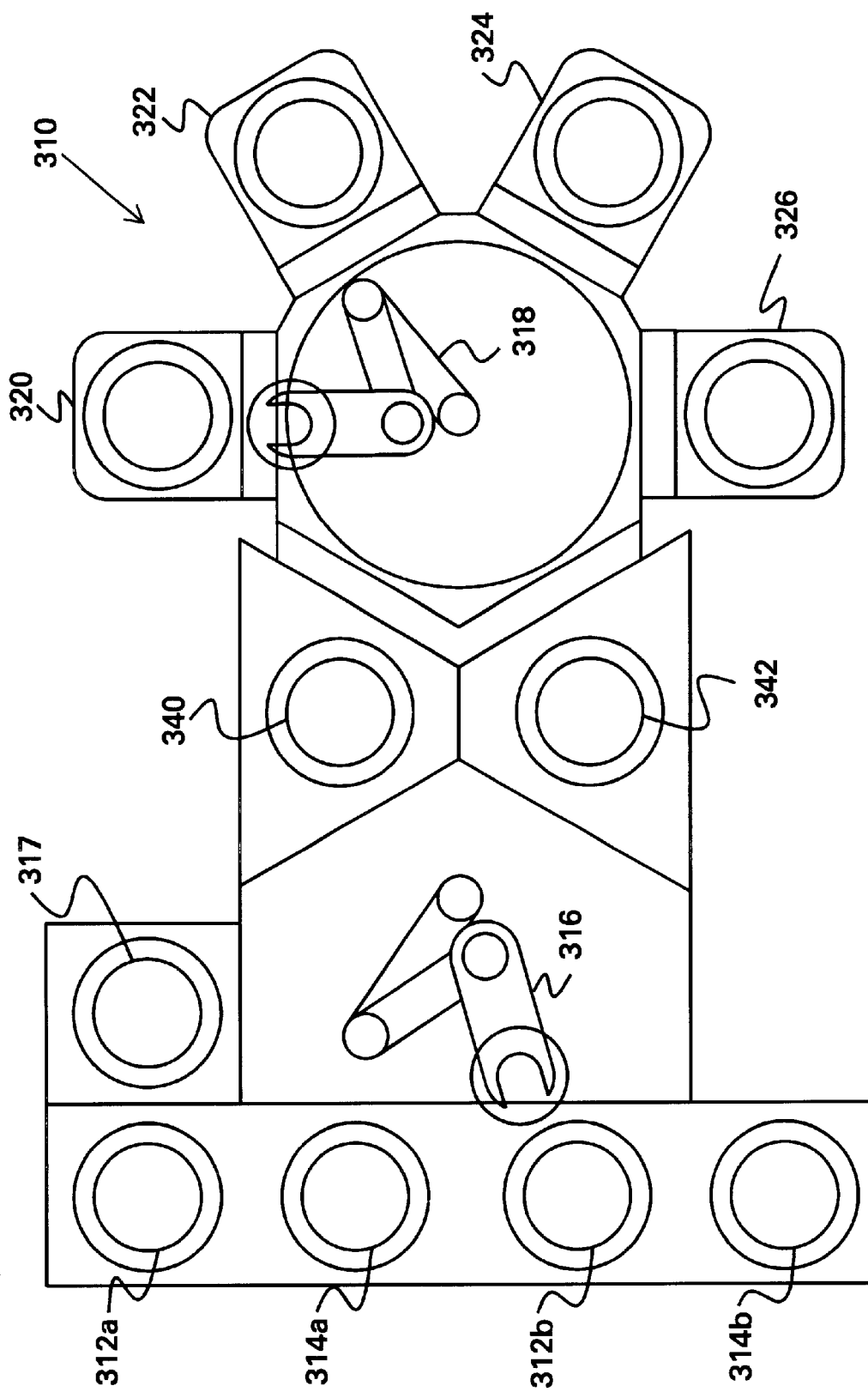
FIG. 3 is a schematic diagram of a third prior art cluster tool architecture.
Figure 4:
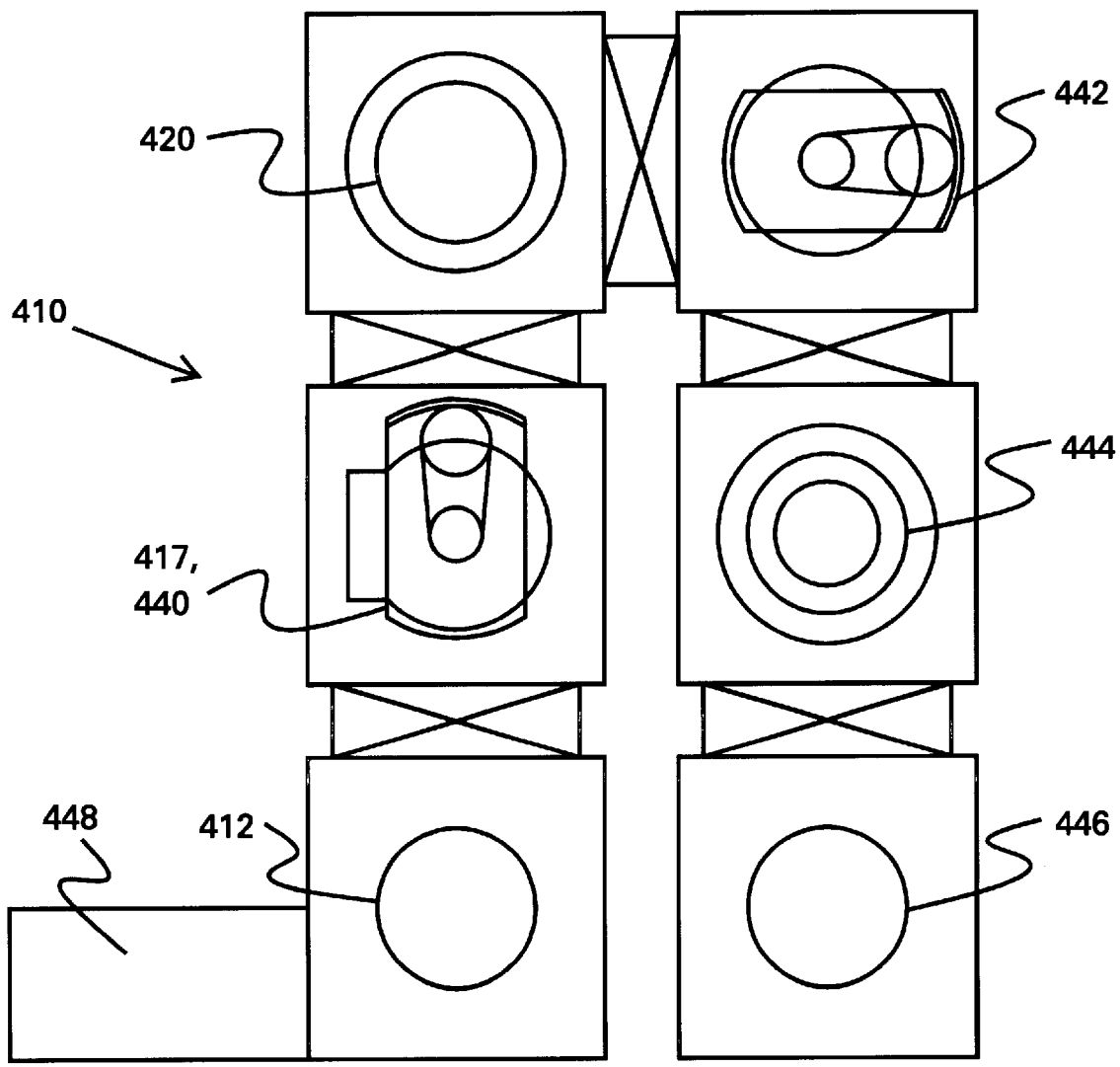
FIG. 4 is a schematic diagram of a fourth prior art cluster tool architecture.

Reference is now made in detail to a specific embodiment of the present invention, which illustrates the best mode presently contemplated by the inventor for practicing the invention. Alternative embodiments are also briefly described as applicable.

Integration of component processing by a combination of vacuum and atmospheric or high pressure processing is required, in a programmable order. The substrates, which in this case are silicon wafers, flat panel displays, thin film heads, hard disk drive substrates, hybrid circuit substrates, ink jet head substrates, flexible circuits, MEMS substrates or printed circuit boards, are processed in the following computer-controlled, programmed order automatically:

1. Unloading from a loading/unloading cassette or platform in a user-defined order by a robotic arm, in a controlled atmosphere or ambient or high pressure.
2. Aligning on the robotic arm or, if required, moving the substrate to a station, which finds a flat or notch and centers the substrate.

3. Loading with the atmospheric robot, if required, into an atmospheric process station for pre-processing.
4. Loading with the atmospheric robot into a buffer station where the substrate(s) is(are) pumped down to vacuum or sub-atmospheric pressure.
5. Unloading the substrate or substrates by a vacuum robotic arm from buffer and loading with said vacuum robotic arm, the substrate or substrates into one or more process stations, where vacuum processing takes place, including $SO_3$ treatment. The stations are loaded in random order where first available station gets loaded with the substrate. The substrate may be sent to another process station in the vacuum chamber either prior to or subsequent to $SO_3$ treatment, or both.
6. Unloading, with the vacuum robot, the substrate from a process station after the process is complete and loading into the first available buffer station, where one or more substrates are vented to atmosphere pressure or high pressure.
7. Unloading the substrate or substrates from buffer by the atmospheric robotic arm and moving them, to the first available atmospheric process station, such as a water rinse or process requiring high pressures.
8. Processing the substrate in the atmospheric or high pressure station and complete processing to present a dry substrate for the atmospheric robotic arm to pick up and load into it's original cassette slot, or exit cassette or alternatively re-load into first available buffer for repeated processing.

Pre-processing and/or post-processing of substrates may be done at various stages, as now described.

(a) Pre-Processing—Atmospheric

Pre-processing of a substrate may be done in the atmospheric chamber prior to loading the substrate into the vacuum chamber, for example, in step (3). Such preprocessing may comprise any combination of chemical and physical treatment. Without being limiting, such pre-processing could comprise a sequence of steps, such as a chemical etch followed by a rinse and a drying.

Chemical treatment may be done with one or more various liquid chemicals and solvents, including, for example, various acidic or alkaline solutions commonly employed in photoresist stripping, choline hydrochloride, or various amine-based solutions.

Chemical treatment may be done with one or more reactive gases in neutral, radical, or ionized state, including, for example, at least one of oxygen, nitrogen, hydrogen, forming gas, nitrous oxide, hydrogen fluoride, and vapor-phase hydrogen peroxide.

Physical treatment may be done with at least one of heat, infrared (IR), ultraviolet (UV) light radiation, high intensity laser energy, high-impact, kinetic energy treatments such as $CO_2$ snow or other cryogenic gases, or high-pressure deionized (DI) water or steam.

Rinsing may be done with low- or high-pressure DI water spray, with or without megasonic and/or ultrasonic treatment and with or without physical scrubbing.

(b) Pre-Processing—Sub-Atmospheric or Vacuum

Pre-processing of a substrate may also be done in the vacuum chamber prior to exposure to $SO_3$, for example, in step (5). Such pre-processing may also comprise any combination of chemical and physical treatments.

Chemical treatment may be done with one or more reactive gases in neutral, radical, or ionized state, including, for example, oxygen, nitrogen, hydrogen, forming gas, nitrous oxide, hydrogen fluoride, and vapor-phase hydrogen peroxide.

Chemical treatment may be done in a plasma environment, such as ashing or reactive ion etching (RIE), including, for example, at least one of oxygen, nitrogen, halogen-containing gases, or sulfur trioxide.

Physical treatment may be done with one or more of heat, IR, UV, or high intensity laser energy.

(c) Post-Processing—Sub-Atmospheric or Vacuum

Post-processing of a substrate may be done in the vacuum chamber subsequent to exposure to $SO_3$, for example, in step (5). Such post-processing may comprise any combination of chemical and physical treatment.

Chemical treatment may be done with one or more reactive gases in neutral, radical, or ionized state, including, for example, at least one of oxygen, nitrogen, hydrogen, forming gas, nitrous oxide, hydrogen fluoride, and vapor-phase hydrogen peroxide.

Chemical treatment may be done in a plasma environment, such as ashing or reactive ion etching (RIE), including, for example, at least one of oxygen, nitrogen, halogen-containing gases, or sulfur trioxide.

Physical treatment may be done with at least one of heat, IR, UV, or high intensity laser energy.

(d) Post-Processing—Atmospheric

Finally, post-processing of a substrate may be done in the atmospheric chamber upon return of the substrate to the atmospheric chamber from the vacuum chamber, for example, in step (7). Such post-processing may also comprise any combination of chemical and physical treatment.

Chemical treatment may be done with one or more various liquid chemicals and solvents, including, for example, various acidic or alkaline solutions commonly employed in photoresist stripping, choline hydrochloride, or various amine-based solutions.

Chemical treatment may be done with one or more reactive gases in neutral, radical, or ionized state, including, for example, at least one of oxygen, nitrogen, hydrogen, forming gas, nitrous oxide, hydrogen fluoride, and vapor-phase hydrogen peroxide.

Physical treatment may be done with at least one of heat, infrared (IR), ultraviolet (UV) light radiation, high intensity laser energy, high-impact, kinetic energy treatments such as $CO_2$ snow or other cryogenic gases, or high-pressure deionized (DI) water or steam.

Rinsing may be done with low- or high-pressure DI water spray, with or without megasonic and/or ultrasonic treatment and with or without physical scrubbing.

1. Apparatus

Figure 5:
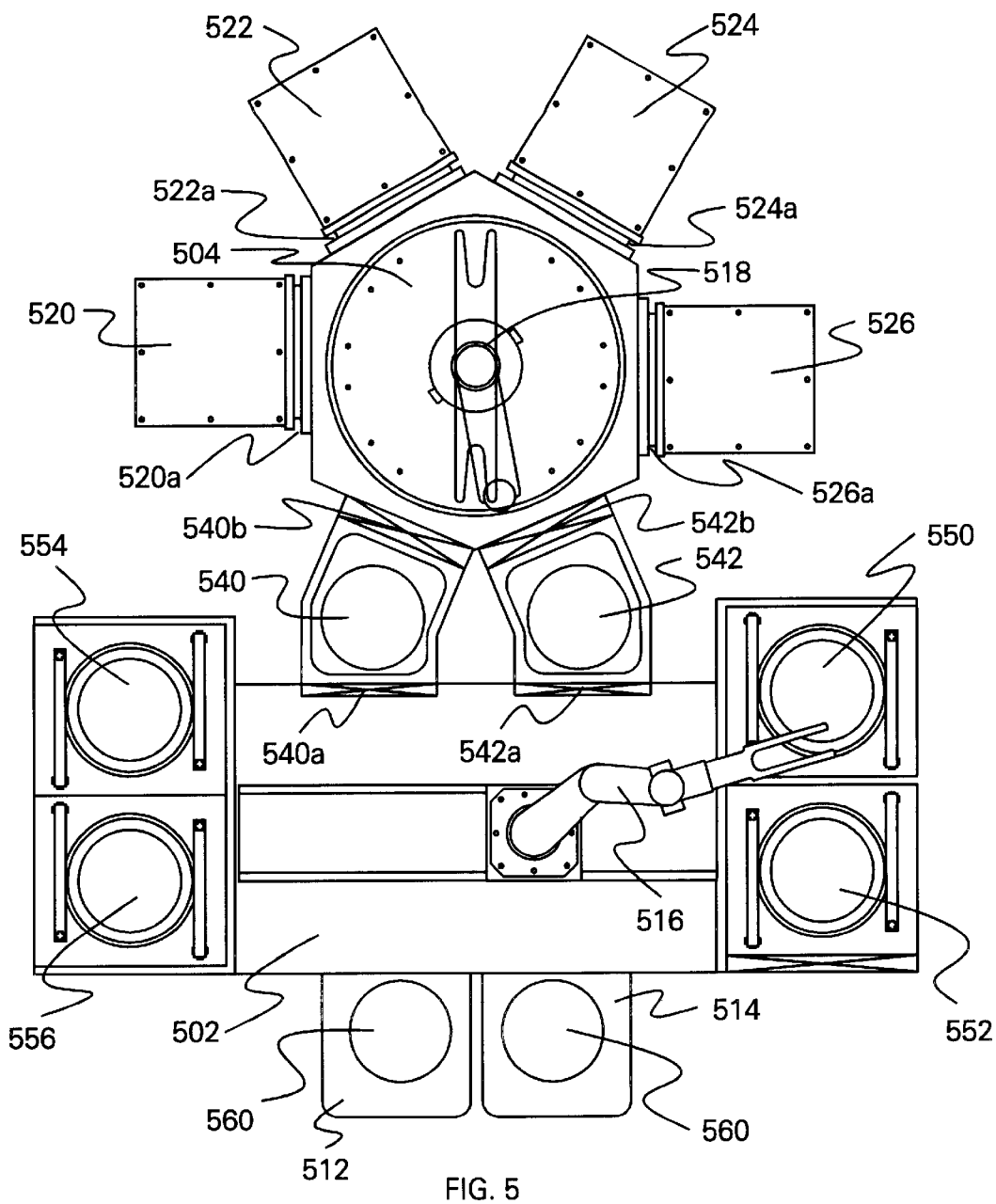
FIG. 5 is a schematic diagram of a cluster tool architecture in accordance with the present invention.

The apparatus 510 of the present invention, shown in FIG. 5, comprises two processing area 502 and 504, the first processing area 502 being an atmospheric (controlled or pressurized) handling platform and the second processing area 504 being an enclosed vacuum station. The two processing areas 502, 504 are interconnected by vacuum buffer stations 540, 542.

Figures 5A, 5B:
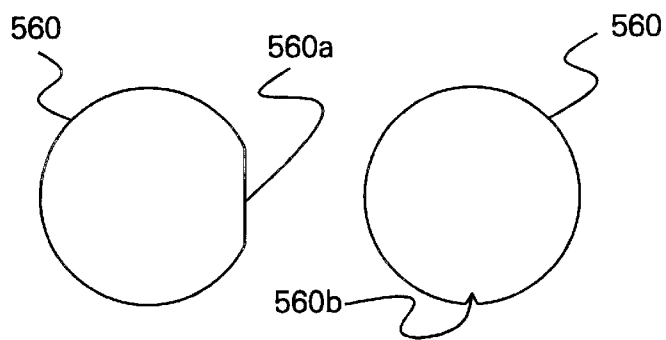
FIGS. 5a and 5b are top plan views of a substrate provided with an orientation mark (FIG. 5a— flat.

A plurality of atmospheric cassettes (shown are two such cassettes) 512, 514 are loaded with 13 to 25 substrates 560 each and placed in the atmospheric processing area 502. The cassettes 512, 514 are accessible by an atmospheric transfer arm 516. The atmospheric transfer arm 516 transfers a single substrate 560 to an optional aligning station or mechanism (not shown), similar to that depicted for the prior art aligning stations 117, 317, 417. This is an optional step and can be done on arm assembly or at a separate station. During alignment, the substrate 560 is aligned so that a flat or notch thereon is always in a determined orientation; see FIG. 5a, which shows the substrate 560 with its flat 560a, and FIG. 5b, which shows the substrate 560 with its notch 560b.

The transfer is done under atmospheric pressure, although the atmospheric processing area 502 is preferably purged with an inert or clean gas, such as nitrogen. The substrate 560 is then loaded into one of the isolated buffer stations 540, 542 and pumped down to sub-atmospheric pressure, to equalize pressure to the enclosed vacuum processing area 504. Alternatively, the substrate 560 may be first transferred to one or more process stations 550, 552, 554, 556 for pre-processing of the substrate, as disclosed in U.S. Pat. No. 5,763,016, and then loaded into one of the buffer stations (540 or 542).

Additionally, the substrate flow can include pre-processing in one of the vacuum processing stations 520, 522, 524, or 526, configured to perform an integrated process such as plasma ashing, plasma pattern etching, or gas phase HF processing. Any pre-processing that is desired may be done in a separate station from the main process station or in the same station. This is controllable by a computer control system and appropriate software.

Vacuum robot arm, or vacuum transfer arm, 518 unloads the substrate 560 from the buffer station (540 or 542) and rotates, and then loads to the first available vacuum process station 520, 522, 524, 526. The loaded vacuum process station (520, 522, 524, or 526) is isolated, pumped down, then the substrate is processed (via exposure to sulfur trioxide, $SO_3$, for example, as disclosed in U.S. Pat. Nos. 5,037,506 and 5,763,016).

Once the process is complete, the vacuum process station (520, 522, 524, or 526) is pumped down and purged, and an isolation valve 520a, 522a, 524a, 526a, which separates each vacuum process station from the enclosed vacuum processing area 504, opens when vacuum (pressure) in that vacuum process station is at same level as in the enclosed vacuum processing area. Isolation valves 540a, 540b, 542a, 542b are also located between the buffer stations 540, 542 and both the atmospheric processing area 502 and the enclosed vacuum processing area 504.

The vacuum robot arm 518 then unloads the substrate 560 from the vacuum process station (520, 522, 524, or 526) and rotates and loads the buffer station (540 or 542). The buffer station (540 or 542) then vents to atmospheric pressure or atmospheric process area 502 pressure, which may be an inert gas purge somewhat above atmospheric pressure.

The atmospheric robot arm 516 unloads the buffer (540 or 542) and loads an atmospheric process station 550, 552, 554, or 556 for rinsing and drying. Optionally, the substrate 560 can be transferred to a second atmospheric process station 550, 552, 554, 556, where the substrate is final-rinsed and dried. The coarse and final rinsing steps may employ water or appropriate chemicals for cleaning. In many applications, pre-processing may not be required. On the other hand, it may be desired to perform a light plasma ashing step, for example, which can be done in a separate ashing station in place of $SO_3$ station 520, 522, 524 or 526 (not shown) or in the same station where $SO_3$ processing takes place. The apparatus 510 of the present invention is easily configurable for performing any desired pre-processing steps, whether cleaning, rinsing, ashing, or other pre-processing steps. Further, the substrates may be processed in an atmosphere with a chemical or physical process prior to or post $SO_3$ exposure.

The atmospheric robot arm 516 then unloads the substrate 560 from the second atmospheric process station (554 or 556) and rotates and replaces it in its original slot in the cassette (512 or 514). Alternatively, the atmospheric robot arm 516 can be programmed to place the substrate 560 in an exit cassette slot 512 or 514.

The same process is carried out on all substrates, or wafers, and processing takes place in random order to first available station. Likewise, either buffer station 540, 542 may be equally accessed by either the atmospheric transfer arm 516 or the vacuum transfer arm 518, on a first-available basis.

The buffer stations 540, 542 have capacity for a plurality of substrates 560, so substrates can be unloaded and re-loaded quickly and serve as a staging station if all process stations are busy.

Once the substrates 560 of a cassette or carrier 512, 514 are processed, the cassette can be replaced with an unprocessed cassette while the adjacent cassette is processed. This allows for continuous operation of the system.

The cluster tool architecture 510 of the present invention provides process capability in the atmospheric processing area 502 in combination with process capability in the enclosed vacuum processing area 504 for a single substrate 560 in an integrated fashion, employing buffer stations 540, 542 between the two areas. Movement of the substrate 560 from one area to another is based on a random access architecture, and, after processing in both areas, the substrate is returned to its original slot in the cassette 512, 514 from which it started.

2. Control System Architecture

The cluster processing tool architecture disclosed herein requires computer control so that all functions take place automatically by electrically driven robots. The control system is not novel in nature, but is required for operation of the tool described. Specifically, the control system is commercially available from PRI Automation for its transport module controller robotic handlers for cluster tools.

This computer architecture (FIG. 6) provides the means of computer control. The custom aspects of the software control are centered on the unique process requirements, and the unique tool architecture which is described herein.

The preferred architecture employed herein is one of distributed input/output and computer hardware, where (1) there is a Graphical User Interface (GUI) 600, which allows the operator to program the machine and perform maintenance functions, and (2) there is a Cluster Tool Controller (CTC) computer 602 and software which takes commands from the GUI and performs routing computations to allow substrate traffic to be random or motions to proceed to the first available station. There is also at least one Process Module Controller (PMC) 604a–604d, 606a–606d (eight such are shown) which has software and hardware to communicate with the CTC 602 so that when substrate 560 is introduced, the isolation valve (520a, 522a, 524a, 526a), controlled by the PMC, is opened and the computer-controlled robot arm 516 or 518 is allowed to enter the appropriate process module 520, 522, 524, 526, 550, 552, 554, 556. It will be seen that there is one PMC associated with one process module.

Wafer handling hardware is denoted at 608. This deals with mechanical operation of such items as valves (e.g., valves 520a, 522a, 524a, 526a, 540a, 540b, 542a, 542b, shown in FIG. 5) and robot arms 516 and 518 (also shown in FIG. 5).

The PMC 604 provides the hardware and software handshake to allow complete automatic substrate loading and perform automatic pump-down function and processing per recipe loaded from the CTC computer 602. Communication lines between computers, e.g., between CTC computer 602 and PMC computers 604, are shown by a single shaft arrow "→", while hardware control lines between devices, e.g., between CTC computer 602 and wafer handler hardware 608 and between each PMC computer 604a–604d, 606a–606d and each process module 520, 522, 524, 526, 550, 552, 554, 556, respectively, are shown by a double shaft arrow "⇒".

Industrial Applicability

The cluster tool architecture disclosed herein is expected to find use in processing substrates, including processing using sulfur trioxide.

Thus, there has been disclosed a cluster tool architecture for processing substrates, including processing using sulfur trioxide. It will be readily apparent to those skilled in this art that various changes and modifications of an obvious nature may be made, and all such changes and modifications are considered to fall within the scope of the present invention, as defined by the appended claims.

What is claimed is:

1. A cluster tool architecture for processing substrates, including exposure to at least one process environment, comprising:
   (a) an atmospheric processing area, maintained at atmospheric pressure;
   (b) cassette means for introducing a plurality of said substrates into said atmospheric processing area;
   (c) at least one process station in said atmospheric processing area for exposing said substrates to at least one first process environment;
   (d) an enclosed vacuum processing area, maintained at a vacuum pressure;
   (e) a first buffer station between said atmospheric processing area and said enclosed vacuum processing area to pump and vent from atmospheric to vacuum pressures and transition said substrates from said atmospheric processing area to said enclosed vacuum processing area;
   (f) at least one process station in said enclosed vacuum processing area for exposing said substrates to said at least one second process environment;
   (g) a second buffer station between said atmospheric processing area and said enclosed vacuum processing area to re-pressurize from vacuum to atmospheric pressures and transition said substrates from said enclosed vacuum processing area to said atmospheric processing area;
   (h) an atmospheric transfer arm in said atmospheric processing area for transferring said substrates from said cassette means between one said buffer station and said at least one process station in said atmospheric processing area and then to said cassette means; and
   (i) a vacuum transfer arm in said enclosed vacuum processing area for transferring said substrates from one said buffer station to said at least one process station in said enclosed vacuum processing area and from said at least one vacuum process station in said enclosed vacuum processing area to one said buffer station, wherein both buffer stations are equally accessible to both the atmospheric transfer arm and the vacuum transfer arm.

2. The cluster tool architecture of claim 1, wherein said at least one second process environment comprises exposure to a reactive gas.

3. The cluster tool architecture of claim 2, wherein said reactive gas consists essentially of sulfur trioxide.

4. The cluster tool architecture of claim 1 wherein said atmospheric processing area contains at least one of process station, for cleaning and drying of said substrates.

5. The cluster tool of architecture of claim 1 wherein said atmospheric processing area can contain more than one process station for the cleaning and drying of said substrates or for processing said substrates, whether in an atmosphere with a chemical or physical process prior to or post $SO_3$ exposure.

6. The cluster tool architecture of claim 1 wherein said vacuum processing area contains at least one vacuum process station, for processing a said substrate in said reactive gas.

7. The cluster tool architecture of claim 1 wherein said vacuum processing area contains more than one duplicate vacuum process stations, each for processing a said substrate in said reactive gas.

8. The cluster tool architecture of claim 1 wherein said vacuum processing area contains at least one vacuum process station, for processing a said substrate in said reactive gas plus additional vacuum process stations for integrated vacuum processing, for example, plasma ashing, plasma pattern etching or gas phase HF processing.

9. A method of processing a single substrate at a time in a cluster format, said method comprising:
   (a) unloading at least one said substrate from a loading/unloading cassette in a user-defined order by a first robotic arm, in a controlled atmosphere in an atmospheric processing area;
   (b) optionally aligning said at least one substrate in a station which determines a flat or edge portion of said at least one substrate and centers said substrate;
   (c) loading said at least one substrate into a first available buffer station, where said at least one substrate is pumped down to vacuum or sub-atmospheric pressure;
   (d) unloading said at least one substrate by a second robotic arm from said buffer station and loading said at least one substrate into at least one vacuum process station in an enclosed vacuum processing area, where vacuum processing takes place, said loading taking place in random order in which a first available said vacuum process station is loaded with said at least one substrate;
   (e) removing said at least one substrate by a second robotic arm from said processing station and loading said at least one substrate into at least one subsequent vacuum process station in an enclosed vacuum processing area, where additional vacuum processing takes place, said loading taking place in random order in which a first available said vacuum process station is loaded with said at least one substrate;
   (f) removing said at least one substrate from said vacuum process station after processing is completed and loading said at least one substrate into a first available said buffer station, where said at least one substrate is vented to atmosphere pressure or high pressure;
   (g) unloading said at least one substrate from said buffer station by said first robotic arm and moving said at least one substrate to an atmospheric process station for single substrate or multiple substrate processing; and
   (h) processing said at least one substrate in said atmospheric process station and complete processing to present a dry substrate for said first robotic arm to pick up and load into either an exit cassette or alternatively re-load into first available buffer station for repeated processing.

10. The method of claim 9 wherein said controlled atmosphere is at ambient pressure or high pressure.

11. The method of claim 10 wherein said atmospheric process station is exposed to said controlled atmosphere.

12. The method of claim 11 wherein said atmospheric process station performs a variety of post-processing procedures, including at least one of water rinsing, and processes requiring high pressures.

13. The method of claim 9 wherein in said at least one vacuum process station, said at least one substrate is exposed to a reactive gas.

14. The method of claim 13 wherein said reactive gas consists essentially of sulfur trioxide.

15. The method of claim 9 wherein in said at least one vacuum process station, said at least one substrate is exposed to an integrated process including plasma ashing, plasma pattern etching, or gas phase HF processing.

16. The method of claim 9, wherein said substrate is selected from the group consisting of semiconductor wafers, flat panel displays, photomasks, thin film heads, hard disk substrates, ink-jet heads, flexible circuits, MEMS (Micro Electro Mechanical Systems) device substrates, and printed circuit boards.

17. The method of claim 9, wherein said mechanisms defined by said cluster tool architecture are computer-controlled with appropriate software to perform sequences as described.

18. The method of claim 17, wherein operation of said cluster tool architecture is by means of a computer and a graphical user interface to facilitate human interface with said apparatus.

19. The method of claim 9, wherein after step (a), said at least one substrate is subjected to any combination of first chemical and physical pre-processing steps in said controlled atmosphere.

20. The method of claim 19 wherein said first pre-processing steps include steps selected from the group consisting of:
  (a) chemical treatment with at least one liquid chemical or liquid solvent or both;
  (b) chemical treatment with at least one reactive gas in a neutral, radical, or ionized state;
  (c) physical treatment with heat, infrared, ultra-violet light radiation, high intensity laser energy, high-impact, kinetic energy treatment, or high-pressure deionized water or steam; and
  (d) rinsing with low-pressure or high-pressure DI water spray, with or without megasonic and/or ultrasonic treatment and with or without physical scrubbing.

21. The method of claim 9, wherein in step (d), said at least one substrate is first subjected to any combination of second chemical and physical pre-processing steps in said vacuum, followed by treatment with sulfur trioxide.

22. The method of claim 21 wherein said second-preprocessing steps include steps selected from the group consisting of:
  (a) chemical treatment with reactive gases in neutral, radical, or ionized state;
  (b) chemical treatment in a plasma environment; and
  (c) physical treatment with heat, infrared, ultra-violet light radiation, or high intensity laser energy.

23. The method of claim 9, wherein in step (d), said at least one substrate is subjected to treatment with sulfur trioxide, followed by any combination of first chemical and physical post-processing steps in said vacuum.

24. The method of claim 23 wherein said first post-processing steps include steps selected from the group consisting of:
  (a) chemical treatment with reactive gases in neutral, radical, or ionized state;.
  (b) chemical treatment in a plasma environment; and
  (c) physical treatment may be done with heat, infrared, ultra-violet light radiation, or high intensity laser energy.

25. The method of claim 9, wherein in step (g), said at least one substrate is subjected to any combination of second chemical and physical post-processing steps in said atmospheric chamber.

26. The method of claim 25 wherein said second post-processing steps include steps selected from the group consisting of:
  (a) chemical treatment with at least one liquid chemical or liquid solvent or both;
  (b) chemical treatment with at least one reactive gas in a neutral, radical, or ionized state;
  (c) physical treatment may be done with heat, infrared (IR), ultra-violet light radiation, high intensity laser energy, high-impact, kinetic energy treatment, or high-pressure deionized water or steam; and
  (d) rinsing with low- or high-pressure deionized water spray, with or without megasonic and/or ultrasonic treatment and with or without physical scrubbing.

* * * * *